(12) United States Patent
Kumar et al.

(10) Patent No.: US 6,839,799 B2
(45) Date of Patent: Jan. 4, 2005

(54) METHOD FOR THE PRIORITIZATION OF DATABASE ENTRIES

(75) Inventors: Pamela Kumar, Bangalore (IN); Mohit Sharma, Bangalore (IN); Damodar Reddy Thummalapally, Milpitas, CA (US); Tavare Dhanaraj B., Maharashta (IN)

(73) Assignee: Alliance Semiconductor, Santa Clara, CA (US)

( * ) Notice: Subject to any disclaimer, the term of this patent is extended or adjusted under 35 U.S.C. 154(b) by 611 days.

(21) Appl. No.: 09/908,483

(22) Filed: Jul. 17, 2001

(65) Prior Publication Data

US 2003/0033326 A1 Feb. 13, 2003

(51) Int. Cl.[7] .................................. G06F 12/00
(52) U.S. Cl. ............................ 711/108; 365/49
(58) Field of Search ..................... 365/49; 711/108, 711/129, 144, 145, 151, 153, 156, 158, 173, 217, 220

(56) References Cited

U.S. PATENT DOCUMENTS

| | | | |
|---|---|---|---|
| 5,454,094 A | 9/1995 | Montove ................... 711/108 |
| 5,555,397 A | 9/1996 | Sasama et al. ............... 711/158 |
| 5,787,483 A | * 7/1998 | Jam et al. .................... 711/158 |
| 5,883,901 A | * 3/1999 | Chiu et al. ................... 370/508 |
| 6,069,573 A | 5/2000 | Clark, II et al. .............. 341/50 |
| 6,118,682 A | 9/2000 | Martin ......................... 365/49 |

FOREIGN PATENT DOCUMENTS

JP          11-126486          5/1999

* cited by examiner

*Primary Examiner*—Reginald G. Bragdon
*Assistant Examiner*—Christian P. Chace
(74) *Attorney, Agent, or Firm*—Thelen Reid & Priest LLP

(57) ABSTRACT

A method is provided for prioritizing the entries in a database, where each entry is composed of multiple dimensions. Prioritization is required when there are multiple matches in the database. The number of matches can be the same as the number of entries in the database. To prioritize such a huge number of entries in a minimum number of clock cycles, a distributed prioritizer is implemented by partitioning stored binary data into half nibbles comprising of two bits of data each. Each half nibble is encoded into an expanded format allotting priority value to the stored encoded half nibbles. The stored encoded half nibbles are compared across a word array to determine an exact match.

20 Claims, 3 Drawing Sheets

METHOD FOR THE PRIORITIZATION OF DATABASE ENTRIES

FIELD OF THE INVENTION

The present invention relates to a method for the prioritization of entries in a database. The present invention particularly relates to a method for the prioritization of entries in a database wherein each entry is composed of multiple dimensions.

Prioritization is required when there are multiple matches in the database. The number of matches can be same as the number of entries in the database. To prioritize such a huge number of entries in a minimum number of clock cycles, distributed prioritizer is implemented.

BACKGROUND OF THE INVENTION

Random access memory ("RAM") is the most common form of integrated circuit memory available in the state of the art. However, RAM devices are not suited for use in systems which process associative data. For example, the well known methodology of sequentially accessing data when addressing the RAM is inefficient for systems involving stored information involving pattern recognition, data compression, natural language recognition, sparse matrix processes, and data-base interrogation. The address associated with the desired stored data may not be known. For this type of data, it is more efficient to interrogate a memory by supplying a compressed subset of the desired data or a code representative of the full data set. The memory responds by indicating either the absence of the desired data set or presence of the data set by issuing a match signal and an associated address in the memory bank for the data set.

Content addressable memory (CAM) cells were developed to have ambiguous and non-contiguous addressing. For associative data search, the entire CAM can be searched in a single clock cycle, giving it a great advantage over the sequential search technique required when using a RAM device.

Content addressable memories (CAMs) compare a search word with a set of stored words. When the search word matches with one or more stored words, an indication is produced in respect of each stored word. A distinguishing characteristic of a CAM is that each stored word is uniquely identified on the basis of the content of the word itself, rather than by its address within the memory array as in conventional digital memories.

A CAM includes an array of memory cells arranged in a matrix of rows and columns. Each memory cell stores a single bit of digital information. The bits stored in a row of memory elements constitute a stored word. During a match operation, a search word of input data is applied to all the rows, and an indication is produced for each row as to whether or not the search word matches the word stored therein.

Content addressable memory facilitates searches on a conventional indexed random access memory (RAM). The CAM stores a series of "tags" which represent address locations in the RAM. Match operations are performed on the CAM in order to find the locations of data stored in the RAM. When match data is presented to the CAM, the CAM responds with a "tag" representing the address location in RAM containing the desired data. This address location can then be fed to the RAM's address lines in order to access the data.

The most critical path through the CAM is the search cycle; that is, the time from receipt of an input data signal, or code, to the encoder input to determine if the CAM has the desired data set to the time of the output of a match or mismatch indication, and, if a MATCH signal is generated, the MATCH ADDRESS. Depending on the nature of the data, the CAM core memory can contain locations with redundant information. Therefore, a search will result in a MATCH for more than one MATCH ADDRESS. In this event, it is necessary to determine which MATCH ADDRESS is to be selected on a basis of priority.

Another significant problem can take place in the case of a multiple match, i.e., when more than one row of the CAM tries to indicate a match with the match data. If the CAM lines are connected directly to the RAM's address lines, then a multiple match results in more than one RAM address line being asserted simultaneously. The assertion of multiple address lines affects the response-capability of some RAMS and can even be destructive for some RAM's.

PRIOR ART

U.S. Pat. No. 5,454,094 discloses a circuit and method for detecting multiple matches or hits in a content addressable memory (CAM). The circuit includes a logarithmic index generator or encoder, and a converter which provides a unary signal to an attached random access memory (RAM) in order to protect the RAM from simultaneous multiple addressing attempts. The circuit also includes a plurality of inverters for inverting the unary signal, and generates a signal indicating the presence of multiple matches in the content addressable memory when corresponding digits of the inverted unary signal and an address signal are both asserted. The circuitry for generating the multiple match signals includes a plurality of AND gates coupled to output lines of the CAM, a plurality of line transistors, and a pull-up transistor coupled to a multiple match or hit line.

U.S. Pat. No. 6,069,573 discloses a method and apparatus for prioritizing encoded MATCH signal and MATCH ADDRESS signals for a content addressable memory array. Each CAM core has an output encoder for providing a MATCH signal and, if a MATCH is determined, a MATCH ADDRESS signal indicative of locations in the CAM of the data of interest. The priority encoder output signals are encoded to provide a final MATCH signal and a final MATCH ADDRESS to only the highest priority MATCH ADDRESS from the CAM core having the data, thereby solving the problem of determining which of a plurality of CAM matches to select. The method of this patent involves prioritizing redundant signals of an electronic apparatus having a plurality of output digital bit signals adapted to be combined to form concatenated digital signals composed of plurality of bits specifying a predetermined signal content. Said apparatus having redundant digital signal outputs specifying said predetermined signal content by the steps of dividing said plurality of output digital bit signals into sets, each of said sets adapted to have full signal content of a concatenated digital signal; and concatenating only first engaged digital bit signals and blocking each subsequent bit signal of each of said sets such that only a first engaged concatenated digital signal is output specifying said predetermined signal content.

U.S. Pat. No. 6,118,682 discloses a method and apparatus for reading multiple matched addresses. This patent provides a storage device, such as a content addressable memory, which enables multiple matches to be simply and efficiently examined during a multiple match cycle, regardless of the size of the storage device. For example, where two matched entries in a content addressable memory correspond to a search address, exemplary embodiments reduce the task of examining the locations of these matches to processing only two matched addresses as opposed to having to match all entries of the content addressable memory. By providing an efficient access to multiple matched entries of a memory, the multiple matches can actually be used in an ordered manner to access different branches of a secondary memory. The use of a relatively simple control scheme enables the control logic to be implemented on a single integrated circuit chip with the memory device itself (e.g., a content addressable memory). Exemplary embodiments of the present invention enable the user to reset an original multiple matched condition, thereby allowing the user to perform several examinations of the data/address. Thus, if an error occurs during processing of multiple matches, the user can easily restart the examination process.

JP 1 1126486A2 discloses a method for assigning priority order of a coincidence signal and a coincidence address signal in an encoder of a content addressable memory. In this patent, the device for assigning the priority order of coincidence signals and coincidence address signals that are encoded for the CAM array are provided. Each CAM core is provided with output encoders, which offer coincidence signals and the coincidence address signals showing the positions of the data forming objects in the CAM when a coincidence is discriminated. The output signal of the precedence encoder is encoded and the final coincidence addresses and the final coincidence addresses for the coincidence address along of highest priority order from the CAM core having data are offered, thereby solving the problem in respect of which one of plural CAM coincidences must be selected.

U.S. Pat. No. 5,555,397 discloses a priority encoder applicable to large capacity content addressable memory and provided with priority circuitry for sequentially producing priority-ordered output signals and encoding circuitry for encoding the output signal. Small input, small unit priority circuits are used to form the priority circuitry into a hierarchical structure. An OR output of a small unit priority circuit in a lower hierarchy is used as an input signal of another small unit priority circuit in a higher hierarchy.

An output signal of the priority circuit in the higher hierarchy has an address which corresponds to the address of the one input signal and is made an enable signal of the priority circuit in the lower hierarchy. The priority encoder, though simple in structure and formed with a small number of elements, operates at a high speed. Moreover, an encoder with a prefetch circuit is built into the priority encoder provided for a CAM block. While a "hit" signal in a first priority subblock is being encoded, a hit signal in a second priority subblock can be stored in the prefetch circuit. Therefore, the encoding operation is performed without subblock-to-subblock switch time, making the encoder best suitable for a large capacity, high speed CAM.

It is well recognized in the art that in information technology, the ability to store, obtain, access, retrieve and transmit information in the least possible time and with the highest possible accuracy is highly critical. As the use of the Internet for the voice and data communication increases, the need for faster and accurate transfer and retrieval of data increases. The currently available technology does not support or provide for speed or accuracy in data matching. Another problem is that quite often multiple matches are obtained for a simple search requiring several rounds of searching before an accurate result can be obtained.

Typically, the data or voice communication over the Internet is performed in accordance with a specific protocol. Each protocol specifies how the data is sent from the source point to the destination point.

The IP protocol governs the data and voice communication over the internet. The CIDR protocol, which is a subset of the IP protocol, governs the addressing over the Internet. Under the CIDR protocol, the correct destination address is the one that is associated with the longest prefix. Each Internet address in the CIDR protocol is associated with an IP address and a sub-net mask value. In each router, the routing tables are constructed out of prefix information and are searched using a destination address to determine the exit port of the router. According to the CIDR protocol, a sub-net mask value could only include a series of consecutive 1's followed by 0's. "1" represents that the corresponding bit in the associated IP address is used to determine the final physical address of the destination.

A transfer of information between two points begins by the user sending a packet of information to the receiver. Depending upon the location of the receiver, the information may have to travel through several networks before it reaches the receiver. It therefore, becomes very important that the information travels accurately through the shortest possible route from the sender to the receiver. It becomes all the more difficult since different destinations may have portions of their address in common with each other.

As the number of networks and destinations which are interconnected increases by the day, it is highly important that routers in each network are able to route the information as fast and as accurate as possible to the final destination. The current technology takes a long time to determine the correct address in a router to route the information. For example, a 32 bit address requires up to 31 clock cycles to be determined in the currently available technology. In the networks incorporating a wider address such as 128 bits, it would take more time to accurately determine the address of the final destination.

Another significant problem in the prior art is that the output data is encoded into $2^n-1$ times. As a result, the number of encoded bits is very large thereby causing problems in terms of space requirement. For example, a 16 bit data is encoded into 255 bits thereby requiring large amounts of space.

Another problem associated with priority resolution in multiple matches in the art is that since priority is based on the assumption that the lowest address has the highest priority, database entries require to be pre-sorted in the order of priority and loaded on the database. As a result, for each update, a fresh sorting is required before the entries can be loaded into the database. Not only is this process time consuming, but is also tremendously expensive.

OBJECTS OF THE INVENTION

The main object of the invention is to provide a method for prioritizing entries in a database.

It is another object of the invention to provide a prioritization circuit for enabling prioritization of data amongst multiple matches.

It is another object of the invention to provide a method for the prioritization of entries in a database that does not require large amount of bits and is therefore relatively economical.

It is a further object of the invention to provide a method for the prioritization of entries in a database that does not require pre-sorting or resorting at each update.

It is a further object of the invention to provide a method for the prioritization of entries in a database in the minimum number of clock cycles.

It is another object of the invention to provide a content addressable memory system which solves the competition in the CAM retrieval that has the possibility of two or more coincidences and improves the speed of the CAM retrieval cycle without necessitating the improvement of the production process of the integrated circuit.

Each entry in the database is assigned a priority value which value is then stored in a specially encoded form. The priority value can be assigned by the user. As a result, the entries in the database do not have to be pre-sorted and can be stored in any arbitrary form.

The priority value assigned to each stored entry is done in order to reduce logic complexity. The expanded format that can be used to encode and store is a function of the space available and time. Typically, a given binary data is partitioned into pairs of bits termed half nibbles. Each half nibble is then encoded. For example, 16 bits binary data will have 8 half nibbles, which are then encoded. Similarly, 32 bits of binary data will have 16 half nibbles which are then encoded.

In the prior art, N number of binary bits are encoded into $(2^N)-1$ bits. This requires a tremendous increase in space on the chip and is therefore expensive. For example, using prior art techniques if 16 bits are encoded, the final result is 255 bits. As explained hereinabove, the resulting large number of bits requires tremendous space and is very expensive. The present invention overcomes this problem by encoding two bits (half nibble) at a time out of N bits. In one embodiment, two bits are encoded into three bits. Thus N bits are encoded into $(N/2)*3$ bits. For example, when 16 bits are to be encoded, encoding is actually done for 8 half nibbles. The expanded format for 8 half nibbles therefore comprises 24 bits instead of 255 bits for 16 bits as in the art. Each encoded half nibble is allotted a priority value as decided by the user.

DETAILED DESCRIPTION OF THE INVENTION

As explained above, each entry in the database is allotted a priority value, which is then stored in a specially encoded form. The encoding of the priority value reduces the complexity of the logic involved. The expanded format that can be used for the encoding is a function of the tradeoff between time and the space available. Encoding is done for pair of bits (half nibble) in a given binary data. For example, 16 bits binary data will have 8 half nibbles, where each half nibble is encoded. Table 1 provides an example of encoding two bits into three bits.

TABLE 1

| Half Nibble | Expanded Format |
| --- | --- |
| 00 | 000 |
| 01 | 001 |
| 10 | 011 |
| 11 | 111 |

00 is highest priority and 11 is lowest priority

In table 1 and generally herein, highest priority is designated by 00 and lowest priority by 11.

As explained above, the invention involves the encoding of two bits at a time out of N bits. If the expanded format chosen is to encode two bits into 3 bits, the formula applied for N bits is $(N/2)*3$ bits. For example, 11 00 10 01 will be encoded as 111 000 011 001.

For each database entry, the encoded priority value is stored in the following manner:

| Pri[2] Pri[1] Pri[0] | Detect | Pri[2] Pri[1] Pri[0] | Detect | ... | ... |
| --- | --- | --- | --- | --- | --- |
| Pri[2] Pri[1] Pri[0] | Detect | Pri[2] Pri[1] Pri[0] | Detect | ... | ... |
| Pri[2] Pri[1] Pri[0] | Detect | Pri[2] Pri[1] Pri[0] | Detect | ... | ... |

As can be seen, the consecutive half nibble is searched only after a positive match is detected by the detector associated with the previous half nibble.

In the event of multiple matches between the search data and the stored data in the CAM cell, all the bits of stored encoded half nibbles corresponding to the multiple matches are wire ANDed across the word array in the full chip and the final wire AND result of the all the entries that resulted in a match is generated. This wire-anded result of all the entries which matched is then applied back to the stored half nibbles in order to perform an exact match between the stored data and the applied data. The half nibbles which match are detected by the respective detectors. The detector ensures that wire ANDing of the succeeding half nibble begins only in the event of match with the previous half nibble.

The sequence of the method of the invention is from the highest half nibble to the lowest half nibble. Since each half nibble's wire-ANDing begins only if the immediately prior half nibbles match, the highest priority entry is one wherein a match is generated for the lowest half nibble.

The lowest half nibble generates a match only if all the preceding half nibbles have already generated a match. The stored encoded half nibbles have an associated detector. The detector detects whether the associated half nibble's data matched with the applied wire-ANDed data. In the absence of a match, the detector ensures that the next lower half nibble does not give a match, even if the stored and applied data for that half nibble match.

The wire-ANDing of the stored half nibbles in the full chip to get the highest priority half nibble, and applying it back to the cell for the exact match so that the detector can detect the match, is done in one clock cycle. Thus, the wire-ANDing and match generation can be pipelined. For example, in the case of an eight bit priority field, four cycles are required to prioritize the data entry since four half nibbles are created out of the 8 bit priority field.

The following example provides one embodiment of the invention where the use of three encoded half nibbles for each entry results in a search performed in three cycles.

| WORDARRAY1 | | WORDARRAY2 | | WORDARRAY3 | |
|---|---|---|---|---|---|
| Binary | hn2 hn1 hn0 | Binary | hn2 hn1 hn0 | Binary | hn2 hn1 hn0 |
| 000110→ | 000 001 011 | 110100→ | 111 001 000 | 010101→ | 001 001 001 |
| 101010→ | 011 011 011 | 000111→ | 000 001 111 | 110000→ | 111 000 000 |
| 011011→ | 001 011 111 | 101111→ | 011 111 111 | 000001→ | 000 000 001 |
| 000111→ | 000 001 111 | 000000→ | 000 000 000 | 111110→ | 111 111 011 |

In the first cycle, the values of the highest half nibble (hn2) is wire-ANDed across word arrays 1, 2, and 3. In the first multiple match, the wire-AND of hn2 in all of word arrays 1, 2, and 3 is 000 indicating that there have been matches in all three word arrays. In order to determine the exact matches, the result of all the hn2's is wire-ANDed and applied back to the storage cells. When the data is applied back, an exact match is detected only for Rows 1 and 4 in word array 1, Rows 2 and 4 of word array 2 and Row 3 of word array 3.

The exact sequence of steps involved in the first cycle is given below:
Wire AND of hn2 of wordarray1=000 (A)
Wire-AND of hn2 of wordarray2=000 (B)
Wire-AND of hn2 of wordarray3=000 (C)
Wire-AND of all hn2 stored=(A) &&(B)&&(C)=000
Wire-ANDed result of all hn2's is applied back to the storing cells for exact match. Exact match generated in hn2
Row 1 of Wordarray1
Row 4 of Wordarray1
Row 2 of Wordarray2
Row 4 of Wordarray2
Row 3 of Wordarray3.

In the second cycle, the wire-AND of the intermediate half nibble hn1 is applied to only those rows of each word array where an exact match for the previous half nibble hn2 was detected.

The wire-ANDed of hn1 is applied in Row 1 and Row 4 of word array 1, Row 2 and Row 4 of word array 2 and Row 3 of word array 3. When the wire-AND of hn1 is applied to Rows 1 and 4 of word array 1, no exact match is detected resulting in a mismatch in word array 1. An exact match is detected in both word array 2, and in word array 3. The results of the wire-AND of hn1 indicates that there has been a match. The final wire-AND is therefore applied back to all the storage cells where a match was detected. As can be seen, no exact match is generated for hn1 in word array 1. In word array 2, an exact match is detected only in Row 4. In word array 3, an exact match is detected for hn1 only in word array 3.

The exact sequence of steps involved in the first-cycle is given below:
Wire-AND of hn1 in wordarray1 is done only in row 1 and row 4 since these two rows had an exact match in the first cycle.
Result=001
Wire-and of hn1 in wordarray2 will be done only in row 2 and row 4 because these two had an exact match in first cycle.
Result=000
Wire-and of hn1 in wordarray3 will be done only in row 3 and because this had an exact match in first cycle.
Result=000
Wire-and of hn1's for all wordarrays=(001)&&(000)&&(000)=000

This final wire-and is applied back to the storing cells to generate an exact match.
Exact Match Generated in hn1
No Row of Wordarray1
Row4 of Wordarray2
Row3 of Wordarray3.

In the third cycle, the wire-AND of the lowest half nibble hn0 is applied to only those rows of each word array where an exact match for the previous half nibble hn 1 was detected.

Wire-AND of hn0 is not done in word array 1 due to the absence of an exact match for hn1 in the second cycle. The wire-AND of hn0 in the second word array is done only in row 4 since an exact match was detected only in this row for hn1. In the word array 3, wire-AND of hn0 is done only in row 3 since an exact match for the previous half nibble hn1 was detected only in this row. The results of the wire-AND of hn0 indicates that there has been a match. The final wire-AND is therefore applied back to all the storage cells where a match was detected. As explained above, no exact match is generated for hn0 in wordarray 1 since no exact match was detected for the previous half nibble hn1 in wordarray 1. In wordarray 2, an exact match is detected for hn0 only in Row 4. When the wire-AND results of hn0 is applied back to wordarray 3, no match is generated in row 3 of wordarray 3.

The exact sequence of steps involved in the wire ANDing of hn0 across word arrays 1 to 3 in the third cycle is given below:
Wire-AND of hn0 in wordarray1 not done in any row because no row had an exact match in second cycle.
Result=111
Wire-AND of hn0 in wordarray2 done only in row4 because this row had an exact match in second cycle.
Result=000
Wire-AND of hn0 in wordarray3 done only in row3 because this row had an exact match in second cycle.
Result=001
Wire-AND of hn0's for all wordarrays=(111)&&(000)&&(001)=000
Wire-ANDed result of all hn0's is applied back to the storing cells for exact match.
Exact Match Generated in hn0
No Row of Wordarray1
Row4 of Wordarray2
No Row of Wordarray3.

The final result shows that the final match with the highest priority of 000 is obtained only in row 4 of wordarray 2. As can be seen, prioritization of 4*3=12 entries was distributed in three cycles since each entry in the data base had three stored encoded half nibbles.

The method of prioritization according to the invention is carried out in the inventive distributed prioritizes device explained in detail below.

Figure 1:
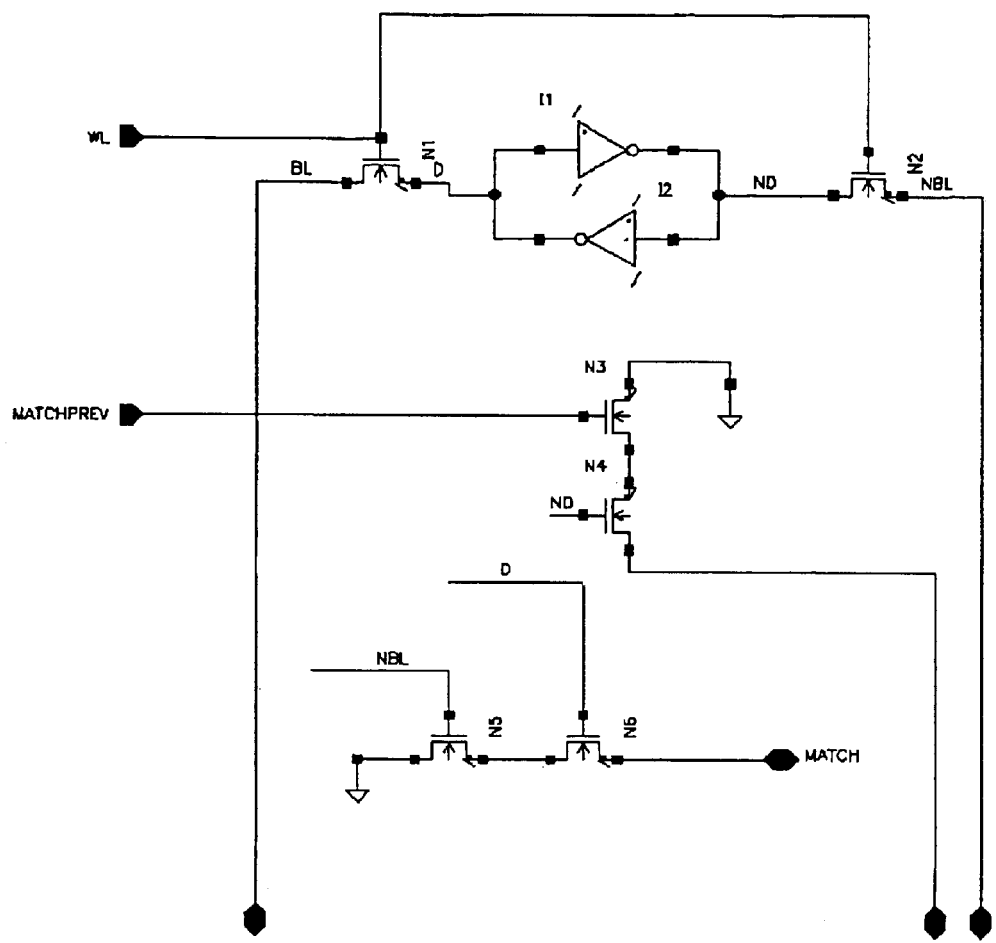
FIG. 1 is a schematic diagram of the distributed prioritizes according to the invention.

FIG. 1 is a schematic of the basic cell used for distributed prioritization of one half nibble according to the invention. The basic cell comprises of a storage means to store one bit of the encoded priority. The storage means comprises of two invertors 11 and 12 connected in parallel. It also has two nmos transistors N1 and N2 thereby forming an SRAM cell with two nodes D and ND.

The SRAM cell is connected at the ND side to the bit line complement NBL and at the D side to the true bit line BL. Transistor gates N1 and N2 are controlled by word line WL. An input (MATCHPREV) is connected at the other end. MATCHPREV line is the input from the previous half nibble's detector which tells whether the previous half nibble had an exact match or not. Prioritizing of the instant half nibble is done only if the previous half nibble has an exact match. WOL line is a common line running vertically through all the rows of a wordarray for that bit and is pre-charged to logic 1. A cell in any of these rows can pull down the WOL line. The wire-AND function in the basic cell is performed by the combination of WOL and transistors N3 and N4. The MATCH line runs horizontally for all the cells forming a half nibble and is common for the encoded half nibble. The final wire-ANDed data of the entire entries is applied through the BL(true) and NBL(complement) to the cell. Transistors N5 and N6 compare the applied bit with the stored bit and pull down the MATCH line in the event of a mismatch.

The MISMATCH function is determined by the following equations:

MISMATCH=(Stored data) && (Complement of applied data).

In other words, MISMATCH=D&&NBL.

When Stored Data is 0 and the Applied Data is 0

Since the stored data is 0, D is 0 and ND is 1. When the data to be applied is 0, the true bit line BL is 0 and complement thereof NBL is 1. As a result of the logic 0 of node D, N6 remains OFF thereby ensuring that the match line is not pulled down. Again, since the stored data is 0, the WOL line is pulled to a logic low of 0, while the MATCH-PREV line remains charged to logic high (if the previous half nibble generated a match).

When Stored Data is 0 and the Applied Data is 1

This situation can never happen since the wire-ANDing ensures that the applied data is 0 whenever the stored data is 0.

When Stored Data is 1 and the Applied Data is 0

Since the stored data is 1, D is 1 and ND is 0. When the data to be applied is 0, the true bit line BL is 0 and NBL is 1. As a result of the logic 1 of node D, N6 turns ON. Also since NBL is 1, gate N5 is ON thereby pulling down the match line MATCH. This indicates that a mismatch has occurred between the stored data and the applied data.

When Stored Data is 1 and the Applied Data is 1

Since the stored data is 1, D is 1 and ND is 0. When the data to be applied is 1, the true bit line BL is 1 and NBL is 0. As a result of the logic 1 of node D, N6 turns ON. Also since NBL is 0, gate N5 is OFF and match line MATCH remains charged to logic HIGH. This indicates that a match has occurred between the stored data and the applied data. Again, since the stored data is 1, ND is 0. This turns OFF N4 and the WOL line remains unaffected.

As explained above, mismatch occurs only when the stored data is 1 and the applied data is 0. If the stored data is 0, the wire-AND function ensures that the applied data is 0.

The WOL line is pulled to low (logic zero) if the stored data is zero (D=0=>ND=1) and the MATCHPREV line is at logic one (implying the previous half nibble generated a match). If MATCHPREV is low, the WOL line remains at a pre-charged value of one. MATCHPREV line is the output of the detector. MATCHPREV has a logic high if there is a match in the previous half nibble. In the event of a mismatch in the previous half nibble, the output from MATCHPREV is 0. The detector circuit is explained next.

Detector Circuit Explanation

Figure 2:
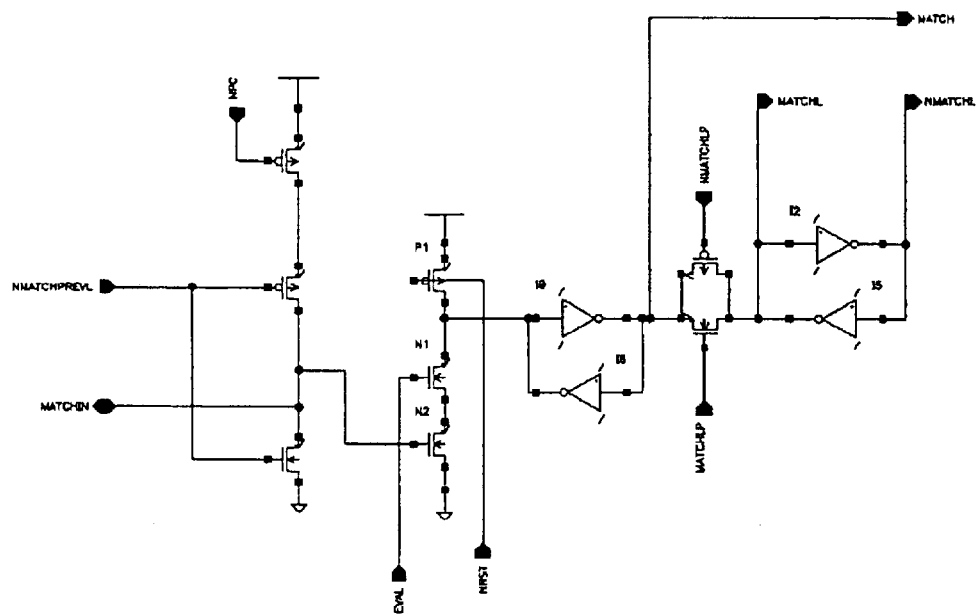
FIG. 2 is a schematic diagram of the detector circuit utilized in the invention.

The match detection means used in conjunction with the cell to ascertain the exact final match is shown in FIG. 2. MATCHIN line is the common match line of the encoded half nibble cells. If any bit in the encoded half nibble mismatches the applied data, the MATCHIN line is pulled down. The role of the detection means is to sense the mismatch and to instruct the next storage cell to stop generation of match for the next succeeding half nibble. NMATCHPREVL is an active low signal, which when at logic low indicates that there was a match in the previous half nibble. The MATCHIN line gets pre-charged when NMATCHPREVL is low and NPC (pre-charge control) signal is low. In such a case, pmos transistors P11 and P12 are ON enabling NPC to pre-charge MATCHIN. Similarly, MATCHIN line is not pre-charged in the event of a mismatch in the previous half nibble since in this case, NMATCHPREVL is logic high preventing the pmos gate P11 from the on state. This ensures that a match is not generated for the current half nibble even if the applied data matches exactly the stored data.

The master latch comprises inverters I0 and I6 connected in parallel. The pmos transistor P1 is controlled by an external control signal NRST. NRST is an active low control signal to reset the master latch. Nmos transistors N1 and N2 are controlled by the external control signal EVAL. When the MATCHIN line value is one, the external control signal EVAL latches a 1 into the master latch. As a result, logic 1 from MATCHIN is passed on to the inverter combination I0 and I6 through gates N1 and N2.

Invertors I2 and I5 form a slave latch with MATCHLP and complement NMATCHLP as the control signal. The master latch is used for pipelining. The output of the master latch MATCH goes to the cell as MATCHPREV. An active low signal source NRST is provided to reset the master latch circuit in order to pre-charge the WOL line in the next prioritizing cell to 1. Therefore after the reset of master latch, the WOL line in the next cell can be pre-charged to one.

Arrangement of Cells with Detector

Figure 3:
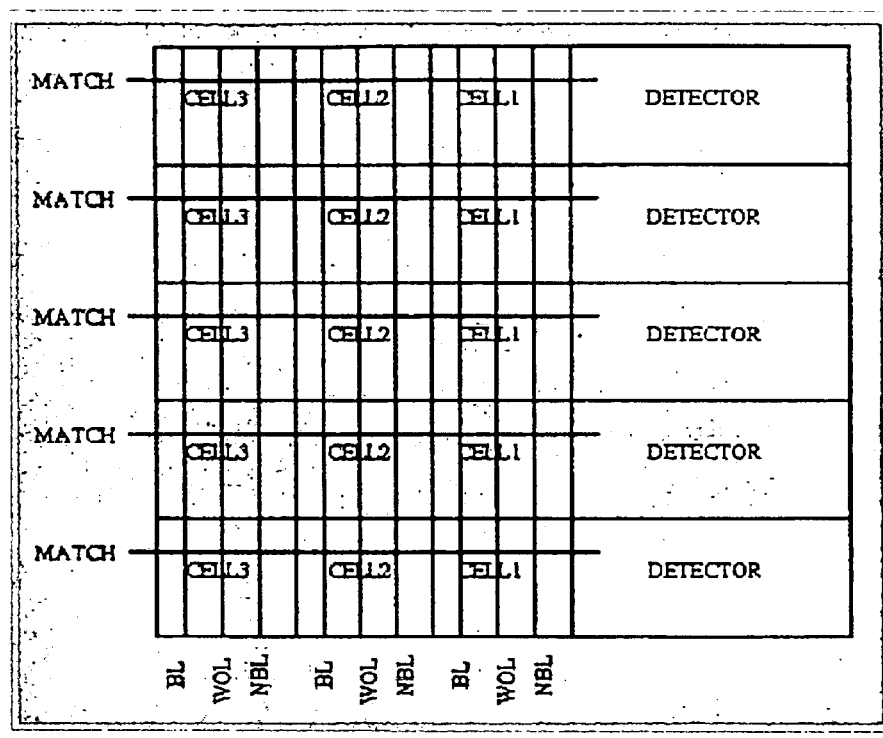
FIG. 3 is a block diagram of the overall arrangement of the cells of the invention with their respective detectors.

FIG. 3 shows the arrangement of cells with detector. MATCH, BL, NBL and WOL lines are also shown. The functioning of the individual components has already been described above and is not reiterated herein for the sake of brevity.

Advantages of the Invention over Prior Art

Prior art devices use a ROM based prioritizer to resolve priority among multiple matches. Priority resolution is based on the assumption that the entry with the lowest address has the highest priority. This however requires that the database entries should be pre-sorted in the order of priority and loaded into the database. As a result, pre-sorting is required for every update. The present invention allows complete flexibility to the user in allocation of priority values and the data base entries can be in any arbitrary order.

What is claimed is:

1. A method for prioritization of data entries in a database for use in the case of a multiple match, said method comprising partitioning stored binary data into half nibbles comprising of two bits of data each, encoding said said nibbles into an expanded format, allotting a priority value to said stored encoded half nibbles, and comparing stored encoded half nibbles across a word array to determine the exact match.

2. The method of claim 1 wherein said comparison is done by wire ANDing the stored encoded half nibble across the word array, generating a wire ANDed match result of all the entries that matched, and applying the said wire ANDed match result back to the stored half nibbles in order to determine an exact match.

3. The method of claim 1 wherein the encoding of the half nibbles is done according to the formula $(N/2)*Y$ where N is the number of bits of data in the entry and Y is the desired level of expansion.

4. The method of claim 3 wherein the number of cycles required for the search is a function of the desired level of expansion Y.

5. The method of claim 4 wherein when the encoded data comprises three bits for each half nibble (Y=3), three cycles are required for the search across each word array for a given data entry.

6. The method of claim 1 wherein the search is done consecutively from the highest half nibble to the lowest half nibble.

7. The method of claim 6 wherein the search for consecutive half nibble is initiated only if the final match output detected indicates a perfect match for the previous half nibble search.

8. The method of claim 1 wherein the search for each half nibble in a word array is done in parallel.

9. The method of claim 1 wherein each half nibble is assigned a set of priority values.

10. The method of claim 1 wherein the match line is pulled down by transistors N5 and N6 depending on the match output obtained from the wire ANDing of the half nibble search data across the stored data for the final match detection.

11. The method of claim 1 wherein if the final match result for the previous cell is a logic low indicating no match, the input to the consecutive cell is pulled down due to the logic high at pre-charge control signal (NPC) and he active low signal (NMATCHPREVL).

12. For use in a method for prioritization of data entries in a database for use in the case of a multiple match, a prioritizing device comprising of at least one data storage means, an input (MATCHPREV) connected at the other end to a detector output for the previous half nibble detector such that prioritizing of the instant half nibble is done only if the asserted value at the input thereof indicate that an exact match occurred for the previous half nibble, a wire ANDing means running through all the word arrays for the particular bit, a match line (MATCH) and bit un (BL/NBL), and a detection means to determine the final match result provided with an output node to pass on final match information to the consecutive cell.

13. The prioritizing device of claim 12 wherein each of said at least one data storage means comprises of two inverters I1 and I2 connected in parallel between two nmos transistors N1 and N2 thereby forming an SRAM cell with two nodes D and ND.

14. The prioritizing device of claim 13 wherein the SRAM cell is connected at the ND side to a bit line complement NBL and at the D side to the true bit line BL, transistor gate N1 being controlled by word line WL which is pre charged to 1 to ensures that N1 is on.

15. The prioritizing device of claim 13 wherein the SRAM which stores the inverters I1 and I2, transistors N1 and N2 stores a bit of the encoded priority.

16. The prioritizing device of claim 12 wherein MATCHPREV line is the input from the previous half nibble's detector and controlling the prioritization as a function of the final match result of the previous half nibble.

17. The prioritizing device of claim 12 wherein a WOL line is a common line running vertically through all the rows of a wordarray for that bit and is pre-charged to logic 1 and is connected to two transistors N3 and N4 in cries to enable the wire AND function.

18. The prioritizing device of claim 12 wherein the MATCH line runs horizontally for all the cells forming a half nibble and is common for the encoded half nibble.

19. The prioritizing device of claim 12 wherein the final wire-anded data of the entire entries is applied through the BL(true) and NBL(complement) to the cell.

20. The prioritizing device of claim 12 wherein transistors N5 and N6 compare the applied bit with the stored bit and pull down the MATCH line in the event of a mismatch.

* * * * *

UNITED STATES PATENT AND TRADEMARK OFFICE
CERTIFICATE OF CORRECTION

PATENT NO. : 6,839,799 B2
DATED : January 4, 2005
INVENTOR(S) : Kumar et al.

It is certified that error appears in the above-identified patent and that said Letters Patent is hereby corrected as shown below:

Column 11,
Line 5, after "said", replace "said" with -- half --.
Line 46, after "(NPC) and", replace "he" with -- the --.

Column 12,
Line 7, replace "indicate" with -- indicates --.
Line 10, after "(MATCH) and bit", replace "un" with -- lines --.
Line 34, after "is connected to two transistors N3 and N4 in", replace "cries" with -- series --.

Signed and Sealed this

Thirtieth Day of August, 2005

JON W. DUDAS
*Director of the United States Patent and Trademark Office*